United States Patent
Ohta et al.

(10) Patent No.: US 9,076,718 B2
(45) Date of Patent: Jul. 7, 2015

(54) OXIDE SEMICONDUCTOR, THIN FILM TRANSISTOR ARRAY SUBSTRATE AND PRODUCTION METHOD THEREOF, AND DISPLAY DEVICE

(71) Applicant: Sharp Kabushiki Kaisha, Osaka (JP)

(72) Inventors: Yoshifumi Ohta, Osaka (JP); Go Mori, Osaka (JP); Hirohiko Nishiki, Osaka (JP); Yoshimasa Chikama, Osaka (JP); Tetsuya Aita, Osaka (JP); Masahiko Suzuki, Osaka (JP); Okifumi Nakagawa, Osaka (JP); Michiko Takei, Osaka (JP); Yoshiyuki Harumoto, Osaka (JP); Takeshi Hara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/478,055

(22) Filed: Sep. 5, 2014

(65) Prior Publication Data

US 2014/0367683 A1    Dec. 18, 2014

Related U.S. Application Data

(63) Continuation of application No. 13/377,824, filed as application No. PCT/JP2010/053987 on Mar. 10, 2010, now Pat. No. 8,865,516.

(30) Foreign Application Priority Data

Jun. 29, 2009  (JP) .................................. 2009-154104

(51) Int. Cl.
*H01L 29/10* (2006.01)
*H01L 21/00* (2006.01)
(Continued)

(52) U.S. Cl.
CPC .............. *H01L 29/22* (2013.01); *G02F 1/1368* (2013.01); *H01L 29/45* (2013.01); *H01L 29/4908* (2013.01); *H01L 29/66742* (2013.01); *H01L 29/7869* (2013.01); *H01L 21/02554* (2013.01); *H01L 21/02565* (2013.01);
(Continued)

(58) Field of Classification Search
USPC ............. 438/104, FOR. 184, FOR. 201, 149; 257/43, E29.296, E21.46, E29.151, 257/E51.005
See application file for complete search history.

(56) References Cited

U.S. PATENT DOCUMENTS

2006/0110867 A1*  5/2006  Yabuta et al. ................. 438/151

FOREIGN PATENT DOCUMENTS

JP        2007-293072 A     11/2007

OTHER PUBLICATIONS

Ohta et al.; "Oxide Semiconductor, Thin Film Transistor Array Substrate and Production Method Thereof, and Display Device"; U.S. Appl. No. 13/377,824, filed Dec. 13, 2011.

*Primary Examiner* — Chuong A Luu
*Assistant Examiner* — Cory Eskridge
(74) *Attorney, Agent, or Firm* — Keating & Bennett, LLP

(57) ABSTRACT

The present invention provides an oxide semiconductor capable of achieving a thin film transistor having stable transistor characteristics, a thin film transistor having a channel layer formed of the oxide semiconductor and a production method thereof, and a display device equipped with the thin film transistor. The oxide semiconductor of the present invention is an oxide semiconductor for a thin film transistor. The oxide semiconductor includes indium, gallium, zinc, and oxygen as constituent atoms, and the oxygen content of the oxide semiconductor is 87% to 95% of the stoichiometric condition set as 100%, in terms of atomic units.

5 Claims, 5 Drawing Sheets

(51) Int. Cl.
*H01L 29/22* (2006.01)
*H01L 29/45* (2006.01)
*H01L 29/49* (2006.01)
*H01L 29/66* (2006.01)
*H01L 29/786* (2006.01)
*G02F 1/1368* (2006.01)
*H01L 21/02* (2006.01)

(52) U.S. Cl.
CPC ...... *H01L 21/02631* (2013.01); *G02F 2202/10* (2013.01); H01L 29/66969 (2013.01)

OXIDE SEMICONDUCTOR, THIN FILM TRANSISTOR ARRAY SUBSTRATE AND PRODUCTION METHOD THEREOF, AND DISPLAY DEVICE

TECHNICAL FIELD

The present invention relates to an oxide semiconductor, a thin film transistor array substrate and a production method thereof, and a display device. Specifically, the present invention relates to an oxide semiconductor suitable as a channel layer of a thin film transistor, a thin film transistor array substrate provided with a thin film transistor having a channel layer formed by including the oxide semiconductor, a production method of the thin film transistor array substrate, and a display device equipped with the thin film transistor array substrate.

BACKGROUND ART

Oxide semiconductors are semiconductor materials having higher electron mobility than silicon-based materials such as amorphous silicon (a-Si). For example, it is considered that use of oxide semiconductors for channel layers of thin film transistors (TFT) can produce highly credible TFTs with low leakage current when no voltage is applied. TFTs including oxide semiconductors have thus been developed.

Quaternary oxide semiconductors (hereinafter also referred to as IGZO semiconductor) containing indium (In), gallium (Ga), zinc (Zn), and oxygen (O) as constituent atoms are considered more suitable for TFT than other oxide semiconductors because they have not only high mobility but also such characteristics as mentioned below.

First, IGZO semiconductors can be formed into a film at relatively low temperatures around room temperatures to about 150° C. In the case of using the aforementioned silicon materials, a film of TFT is formed at high temperatures of not lower than 300° C. Therefore, a TFT cannot be directly formed on a base material which is inappropriate for a high temperature atmosphere, such as flexible substrates including a film base material. However, use of an oxide semiconductor makes it possible to form TFT directly on a flexible substrate. Moreover, an IGZO semiconductor can be formed into a film by a sputtering system and thus can be produced by simple procedures.

Furthermore, thin films formed of an IGZO semiconductor can transmit visible light and are thus excellent in transparency. For this reason, such films can be applied for use in transparent electrodes including indium tin oxide (ITO) or the like.

Meanwhile, characteristics of IGZO semiconductors change depending on the composition of constituent atoms. Patent Document 1 discloses a phase diagram showing preferable compositions of constituent atoms of oxide semiconductors which are suitable as channel layers of TFTs. Patent Document 2 discloses preferable compositions of constituent atoms of oxide semiconductors which are suitable as transparent electrodes, such as TFT.

PRIOR ART REFERENCES

Patent Documents

Patent Document 1: Japanese Patent Application Publication No. 2007-281409
Patent Document 2: Japanese Patent Application Publication No. 2000-44236

DISCLOSURE OF THE INVENTION

With regard to IGZO semiconductors (oxide semiconductors) having the compositions described in Patent Documents 1 and 2, the semiconductor layer formed by including the IGZO semiconductor itself is excellent in mobility, transparency, or the like. However, if the IGZO semiconductor is applied as a channel layer of a TFT, stable and superior transistor characteristics cannot be maintained in some cases.

This is considered to be due to the following reasons: A TFT includes three terminals of a signal electrode, a drain electrode, and a gate electrode. On/Off operation of the TFT is performed by passing an electric current through a region called a channel layer which is provided between the signal electrode and the drain electrode, while controlling the current by the voltage applied to the gate electrode. An IGZO semiconductor constitutes a channel layer, and the signal electrode and the drain electrode are formed after formation of the channel layer. Further, a protective layer for protecting the TFT or an interlayer insulating film for flattening the surface of the substrate having TFT formed thereon are formed.

IGZO semiconductors can be formed into a film at relatively low temperatures as mentioned earlier. However, a higher temperature than the IGZO semiconductor film formation temperature is necessary for formation of electrodes, protective layers, interlayer insulating films, or the like, and a high temperature of 200° C. or higher is sometimes necessary especially for formation of protective layers and interlayer insulating films.

An IGZO semiconductor contains In, Ga, Zn, and O as constituent atoms. If the IGZO semiconductor is subjected to a temperature higher than the film formation temperature, desorption of oxygen contained in the film occurs so that the oxygen content changes. When the oxygen desorption occurs, the composition of the film is largely different from the IGZO semiconductor composition (stoichiometry). As a result, some phenomena occur, such as increase of the off-current, reduction of the electron mobility, and hysteresis in the transistor properties, partly leading to failure to achieve stable TFT characteristics.

The foregoing description exemplified the case of using an IGZO semiconductor as a channel layer of a TFT. If an IGZO semiconductor is applied in other fields, the oxygen content of the actually produced film that is formed of an IGZO semiconductor is also sometimes largely different from the stoichiometric oxygen content.

Patent Document 1 describes the oxygen content of an oxide semiconductor; however, the composition is determined by fluorescent X-ray analysis. This analysis can analyze surfaces of the film (sample) but does not have resolution in the thickness direction. Therefore, the analysis can specify the composition of In, Ga, and Zn but cannot precisely determine the amount of oxygen contained in the entire film. For this reason, the oxygen content described in Patent Document 1 is considered the amount of oxygen calculated based on the (stoichiometric) composition of the film (semiconductor layer) formed by using an IGZO semiconductor, not the amount of oxygen obtained based on the composition of the constituent atoms of the produced film.

Patent Document 2 refers to the amount of oxygen loss. The amount of oxygen loss relates to cations and thus is not uniquely determined. Further, oxygen loss is defined by the amount of carrier electrons. Therefore, unlike the oxygen content described herein, the amount of oxygen loss cannot be quantitatively determined.

The present invention has been devised in consideration of the aforementioned current situation, and aims to provide an oxide semiconductor capable of achieving a thin film transistor having stable transistor characteristics, a thin film transistor including a channel layer formed of the oxide semiconductor and a production method thereof, and a display device equipped with the thin film transistor.

The present inventors made various investigations on an oxide semiconductor capable of achieving a thin film transistor having stale transistor characteristics, and firstly focused their attention on the fact that oxide semiconductors containing In, Ga, and Zn are materials having high mobility and capable of providing transistor characteristics with high credibility (resistance to stress). They also focused their attention on the fact that the composition of an IGZO semiconductor film after made into a product is different from the stoichiometric composition, and that the difference is derived from oxygen desorption from the IGZO semiconductor film caused by heating in the production process. Then, the present inventors found that an IGZO semiconductor suitable as a channel layer of a thin film transistor can be obtained by controlling the oxygen content in the IGZO semiconductor, and that the thin film transistor including the IGZO semiconductor has highly credible transistor characteristics. Thereby, they have found that the foregoing problems can be solved, and accordingly achieved the present invention.

Namely, the present invention relates to an oxide semiconductor for a thin film transistor, and the oxide semiconductor includes indium, gallium, zinc, and oxygen as constituent atoms, and the oxygen content of the oxide semiconductor is 87% to 95% of the stoichiometric condition set as 100%, in terms of atomic units.

The oxide semiconductor containing indium, gallium, zinc, and oxygen as constituent atoms has high mobility and can be made into a film at relatively low temperatures. Further, a film formed by including the oxide semiconductor has an excellent transparency.

The oxide semiconductor of the present invention can be suitably used as a channel layer of TFTs, transparent electrodes, or the like, by controlling the oxygen content of the oxide semiconductor to 87% to 95% of the stoichiometric condition set as 100%, in terms of atomic units. Especially in the case where the oxide semiconductor is used as a channel layer of TFTs, stable transistor characteristics can be achieved. The oxygen content of less than 87% tends to reduce the voltage-current properties of the TFTs. The oxygen content of more than 95% results in excessive resistance of the IGZO film, and thus the oxide semiconductor tends not to function as a channel of the TFTs.

Meanwhile, the oxygen content of the oxide semiconductor can be determined by composition analysis such as auger electron spectroscopy (AES) and X-ray photoelectron spectroscopy (XPS).

As used herein, "stoichiometric condition" refers to a condition in which the charge number of metal ions is equal to the charge number of oxygen ions. Therefore, the oxide semiconductor in the stoichiometric condition does not have conductivity. Moreover, stoichiometry refers to the film composition in an ideal state.

The present invention also relates to a thin film transistor array substrate, including a substrate, and a thin film transistor mounted on a main surface of the substrate, and the thin film transistor includes a channel layer formed of the oxide semiconductor of the present invention. As mentioned earlier, a highly credible thin film transistor can be provided if the thin film transistor includes a channel layer formed of the oxide semiconductor of the present invention having the controlled oxygen content.

The electron mobility of the thin film transistor is not particularly limited but is preferably not less than 0.1 cm$^2$/Vs. The electron mobility of this level can provide favorable transistor characteristics.

In the thin film transistor array substrate of the present invention, preferably, the thin film transistor further includes a protective layer covering the channel layer, and the protective layer contains oxygen atom-containing materials. The oxygen content of the channel layer can be controlled in the aforementioned range by the oxygen atom contained in the protective layer.

The present invention also relates to a display panel equipped with the thin film transistor array substrate of the present invention. Examples of the applicable display device include various display devices having a thin film transistor array substrate, such as liquid crystal display devices, organic EL display devices, plasma display devices, and field emission display devices.

As mentioned earlier, the thin film transistor array substrate of the present invention has stable transistor characteristics. Therefore, display devices provided with the thin film transistor array substrate have high display quality.

The present invention further relates to a method of producing a thin film transistor array substrate. Namely, the present invention relates to a method of producing a thin film transistor array substrate including a substrate and a thin film transistor mounted on a main surface of the substrate. The method includes the steps of forming an insulating film covering a scanning wiring formed on a main surface of the substrate, forming a semiconductor layer to form an oxide semiconductor layer at a position overlapping the scanning wiring upon seeing a substrate surface from a normal direction, forming a wiring and an electrode to form a signal wiring and a drain electrode on the oxide semiconductor layer, forming a protective layer covering the signal wiring and the drain electrode, and forming an interlayer insulating film covering the protective layer. A baking treatment is further included between the step of forming a protective layer and the step of forming an interlayer insulating film.

In the step of forming the insulating film, the scanning wiring partly functions as a gate electrode of the thin film transistor. The scanning wiring is preferably formed of low-resistance metal materials such as titanium (Ti), aluminum (Al), and copper (Cu), and may be a laminate film of such metal materials. For example, the scanning wiring is formed by depositing the metal materials by sputtering on the main surface of the glass substrate to form a laminate film, followed by patterning by a photolithographic method including wet-etching step and resist-peeling step.

The insulating layer is formed by, for example, forming inorganic materials such as silicon oxide (SiOx) and silicon nitride (SiNx) into a film by chemical vapor deposition (CVD) method or the like.

In the step of forming a semiconductor layer, a semiconductor layer is formed by including the oxide semiconductor of the present invention. The method of forming the semiconductor layer is not particularly limited. Examples of the method include a method of firstly forming a film of the oxide semiconductor by sputtering, and then patterning the formed film in a desired shape by photolithographic method. If such a method is employed, various agents such as etching liquids and resist removing liquids are used in the patterning step.

In the step of forming a wiring and an electrode, a signal wiring and a drain electrode are formed on the oxide semiconductor layer. The structures of the signal wiring and the drain electrode are the same as those of the scanning wiring.

In the step of forming a protective layer, a protective layer covering the signal wiring and the drain electrode is formed. The protective layer is formed by, for example, forming inorganic materials such as silicon oxide (SiOx) and silicon nitride (SiNx) into a film by CVD method, or the like.

In the step of forming an interlayer insulating film, an interlayer insulating film covering the protective layer is formed. The interlayer insulating film is formed by, for example, including photosensitive resins.

Meanwhile, according to the present invention, a baking treatment is performed between the step of forming a protective layer and the step of forming an interlayer insulating film in order to control the oxygen content of the semiconductor layer. The baking treatment after forming the protective layer makes it possible to supply oxygen to the oxide semiconductor layer through the protective layer. Alternatively, the oxygen content of the oxide semiconductor layer can be controlled by supplying oxygen to the oxide semiconductor layer from the insulating layer provided on the lower side of the oxide semiconductor layer and from the protective layer provided on the upper side of the oxide semiconductor layer. The oxygen content is not particularly limited but is preferably not less than 90% because such an amount reduces the difference from the stoichiometric condition, and thus stable transistor characteristics can be achieved.

In the method of producing the thin film transistor array substrate of the present invention, the baking treatment is preferably performed at the highest treatment temperature (220° C. or higher) among the treatment temperatures in the production steps of the thin film transistor array substrate. This arrangement makes it possible to easily and assuredly control the oxygen content of the semiconductor layer.

Each of the aforementioned embodiments may be appropriately combined in a scope not departing from the principles of the present invention.

EFFECTS OF THE INVENTION

The oxide semiconductor of the present invention has a predetermined oxide content. Therefore, if the oxide semiconductor is used for example as a channel layer of a thin film transistor, a highly credible thin film transistor with stable transistor characteristics can be achieved. Moreover, a display device including a thin film transistor array substrate equipped with the thin film transistor can display high quality images. Furthermore, the method of producing a thin film transistor array substrate of the present invention includes a baking treatment performed after formation of a semiconductor layer. As a result, the oxygen content in the semiconductor layer can be easily controlled.

MODES FOR CARRYING OUT THE INVENTION

The present invention will be described in detail below by showing embodiments and referring to drawings. The present invention is not limited only to those embodiments.

Embodiment 1

Figure 1:
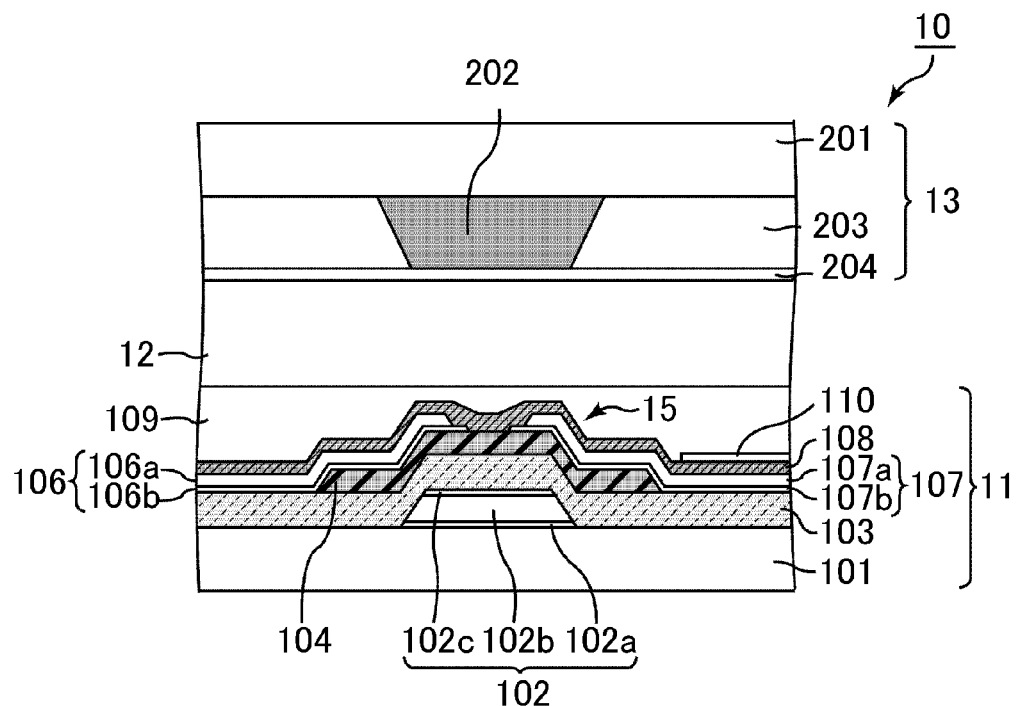
FIG. 1 is a schematic vertical cross-sectional diagram showing a structure of a pixel of a liquid crystal display device according to a first embodiment.

FIG. 1 is a schematic vertical cross-sectional diagram showing a structure of a pixel of a liquid crystal display device according to the present embodiment. In FIG. 1, a liquid crystal display device 10 is provided with a TFT array substrate 11 having a TFT formed therein, a color filter (CF) substrate 13 as a counter substrate disposed facing the TFT array substrate 11, and a liquid crystal layer 12 sandwiched between the above two substrates.

Figure 2:
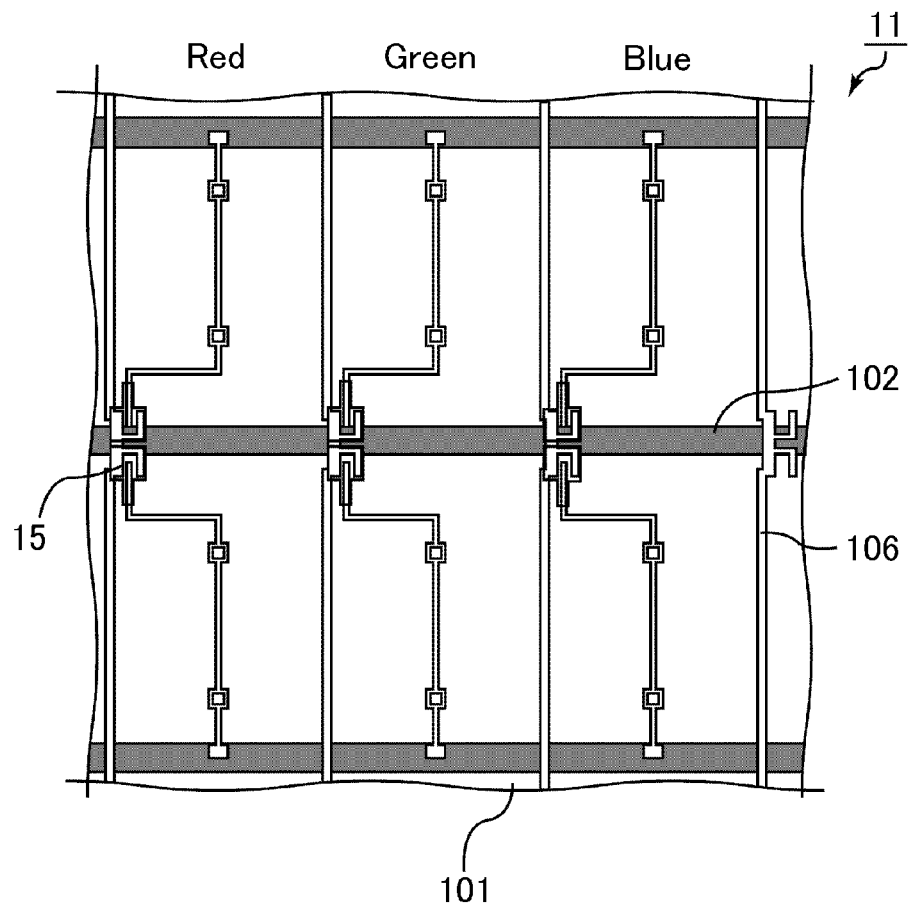
FIG. 2 is a schematic plain diagram showing a structure of a TFT array substrate in the liquid crystal display device according to the first embodiment.

FIG. 2 is a schematic plain diagram showing the structure of the TFT array substrate 11 in the liquid crystal display device of the present embodiment. In FIG. 2, scanning wirings 102 and signal wirings 106 are disposed in a grid pattern on the main surface of a glass substrate 101. In a plurality of pixel areas which are sectioned by the scanning wirings 102 and the signal wirings 106, TFTs 15 as a switch element are formed in the vicinities of the intersections of the scanning wirings 102 and the signal wirings 106.

In a detailed look of the areas where the TFTs 15 are formed, as shown in FIG. 1, the main surface of the glass substrate 101 having the scanning wirings 102 formed thereon is covered by a gate insulating film 103 as an insulating layer. An IGZO semiconductor layer 104 is formed on the gate insulating film 103 in a manner overlapping the scanning wiring 102. The signal wiring 106 and a drain electrode 107 are formed on the IGZO semiconductor layer 104. The TFT 15 is covered with an interlayer insulating film 109 to flatten the protective layer 108 and the substrate surface. A pixel electrode 110 is formed on the interlayer insulating film 109.

The TFT 15 includes the scanning wiring 102 partly as a gate electrode, the gate insulating film 103, the IGZO semiconductor layer 104 as a channel layer, the signal wiring 106, and the drain electrode 107.

The scanning wiring 102 has a structure including laminated scanning wiring layers 102a, 102b, and 102c. An applicable example of the scanning wiring 102 includes a scanning wiring which has a laminate structure consisting of the scanning wiring layers 102a and 102c formed of Ti and having a thickness of 30 to 150 nm, and the scanning wiring layer 102b formed of Al and having a thickness of 200 to 500 nm.

Inorganic materials such as silicon oxide (SiOx) and silicon nitride (SiNx) are applicable for the gate insulating film 103. The thickness of the gate insulating film 103 is set for example to around 200 to 500 nm.

The IGZO semiconductor layer 104 is formed of an IGZO semiconductor which includes In, Ga, Zn, and O as constituent atoms, and has the oxygen content of 87% to 95% of the stoichiometric condition set as 100%, in terms of atomic units. If the channel layer of the TFT 15 is formed of the IGZO semiconductor having the aforementioned oxygen content, the TFT array substrate 11 having stable transistor characteristics can be obtained. The thickness of the IGZO semiconductor layer 104 is not particularly limited, and is around 10 to 300 nm.

The signal wiring 106 partly functions as a source electrode of the TFT 15. As an example of the signal wiring 106, a signal wiring having a structure consisting of laminated signal wiring layers 106a and 106b is exemplified. The drain electrode 107 has a structure consisting of laminated drain electrode layers 107a and 107b. Material of the signal wiring 106 and that of the drain electrode 107 may be the same or different from one another.

Examples of the signal wiring 106 and the drain electrode 107 include a signal wiring and a drain electrode each having a laminated structure in which the signal wiring layer 106a and the drain electrode layer 107a are formed of Ti, and the signal wiring layer 106b and the drain electrode layer 107b are formed of Al. The thickness of the signal wiring layer 106a and the drain electrode layer 107a is for example around 30 to 150 nm, and the thickness of the signal wiring layer 106a and the drain electrode layer 107b is for example around 50 to 400 nm.

As the protective layer, a layer prepared by forming inorganic materials such as SiOx and SiNx into a film by CVD method, sputtering method, or the like can be applicable. The protective layer may include not only a single film of the SiOx film or the SiNx film, but a laminate of the SiOx film and the SiNx film as well. The interlayer insulating film is formed by, for example, including photosensitive resins.

The pixel electrode 110 is formed of a transparent electrode material such as ITO, and the thickness thereof is around 50 to 200 nm.

Meanwhile, the CF substrate 13 has a red (R) CF layer 203, a blue (B) CF layer 203, or a green (G) CF layer 203 in each pixel area on the main surface of a glass substrate 201 as shown in FIG. 1. The CF layers 203 of respective colors are sectioned by a light-shielding member (not shown) called black matrix. A counter electrode 204 having a thickness of around 50 to 200 nm is formed on the surface of the substrate. The area having the light-shielding member formed thereon is provided with a photospacer (not shown).

An example of a method of producing the liquid crystal display device 10 having the aforementioned structure is described with some concrete examples below. First, an example of a method of producing the TFT array substrate 11 is explained with reference to FIG. 3 to FIG. 7. FIG. 3 to FIG. 7 are schematic cross sectional diagrams each showing a step of producing the TFT array substrate 11 of the present embodiment.

Figure 3:
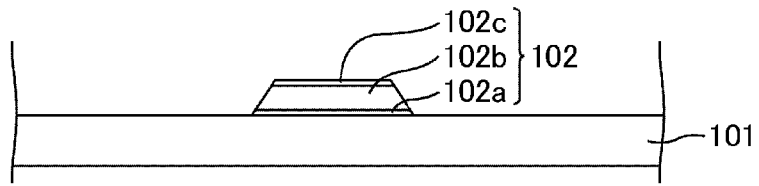
FIG. 3 is a schematic cross sectional diagram showing a step of producing the TFT array substrate according to the first embodiment.

FIG. 3 shows a state in which the scanning wiring 102 is formed on the main surface of the glass substrate 101. For providing the scanning wiring 102, a Ti film having a thickness of 30 to 150 nm, an Al film having a thickness of 200 to 500 nm, and Ti film having a thickness of 30 to 150 nm are formed in said order on the main surface of the glass substrate 101 by, for example, a sputtering method so that the scanning wiring layers 102a, 102b, and 102c are formed. Next, the resulting laminated film is patterned into a desired shape by photolithographic methods (hereinafter, referred simply to as photolithography method) including wet-etching treatment and resist-peeling treatment. Thereby, the scanning wiring 102 can be provided.

Figure 4:
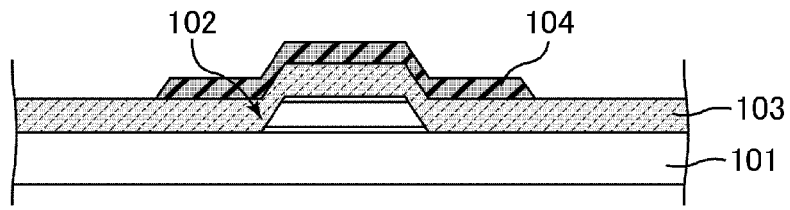
FIG. 4 is a schematic cross sectional diagram showing a step of producing the TFT array substrate according to the first embodiment.

FIG. 4 shows a state in which the main surface of the substrate in the state shown in FIG. 3 is covered with the insulating film 103, and further the IGZO semiconductor layer 104 is formed thereon. The substrate in this state can be obtained by performing the insulating film forming step and subsequently the semiconductor layer forming step.

In the insulating film forming step, the gate insulating film 103 is formed by depositing $SiO_2$ by a CVD method in a manner to have a thickness of 200 to 500 nm and to cover the glass substrate 101 and the scanning wiring 102. In the semiconductor layer forming step, the IGZO semiconductor layer 104 is formed at the position overlapping the scanning wiring 102 when seeing the substrate surface from a normal direction.

The IGZO semiconductor layer 104 can be obtained by firstly depositing a target including In—Ga—Zn—O by sputtering under at an output of 0.1 to 2.0 kW such that a resulting layer has a thickness of 10 to 300 nm, and then pattern-forming the layer into a desired shape by a photolithographic method. The composition ratio of the target may be, for example, In:Ga:Zn:O=1:1:1:4, or In:Ga:Zn:O=2:2:1:7. However, the present invention is not limited to those examples, and the composition ratio of the target may be appropriately set dependent on the film-forming condition.

Figure 5:
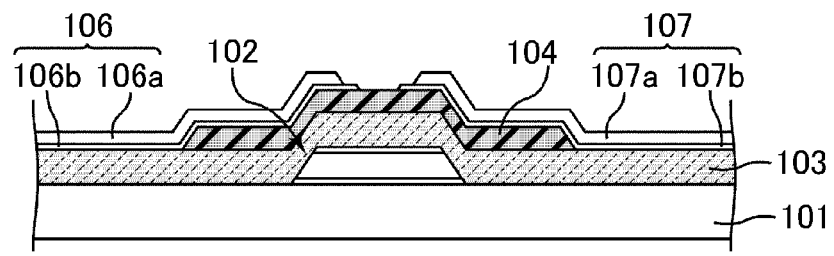
FIG. 5 is a schematic cross sectional diagram showing a step of producing the TFT array substrate according to the first embodiment.

FIG. 5 shows the state of the substrate after the wiring forming step and the electrode forming step. In the wiring forming step and the electrode forming step, the signal wiring 106 and the drain electrode 107 are further formed on the substrate in the state shown in FIG. 4. First, Ti is deposited to have a thickness of 30 to 150 nm by a sputtering method so that the signal wiring layer 106a and the drain electrode layer 107a are formed. Next, Al is deposited to have a thickness of 50 to 400 nm so that the signal wiring layer 106b and the drain electrode layer 107b are formed. The thus obtained laminated layers of Ti and Al are subjected to patterning by a photolithographic method, and thereby the signal wiring 106 and the drain wiring 107 are formed.

Figure 6:
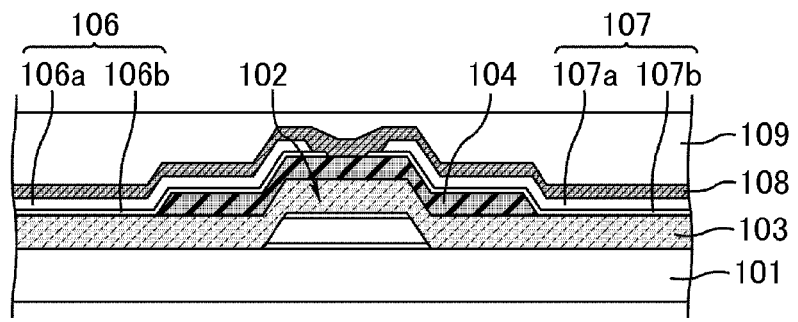
FIG. 6 is a schematic cross sectional diagram showing a step of producing the TFT array substrate according to the first embodiment.

FIG. 6 shows the state of the substrate after the protective layer forming step and the interlayer insulating film forming step. In the protective layer forming step, $SiO_2$ is deposited to have a thickness of 100 to 700 nm by a CVD method so that the protective layer 108 covering both of the signal wiring 106 and the drain electrode 107 is formed.

In the interlayer insulating film forming step, the interlayer insulating film 109 containing a photosensitive resin is formed in a manner to cover the protective layer 108.

Figure 7:
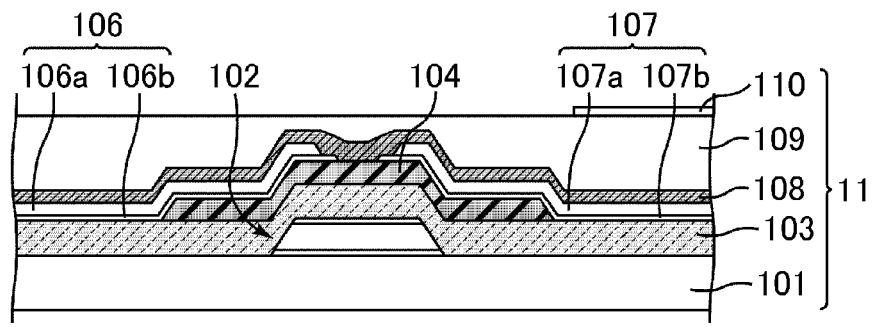
FIG. 7 is a schematic cross sectional diagram showing a step of producing the TFT array substrate according to the first embodiment.

FIG. 7 shows the state after the pixel electrode 110 is formed. The substrate in such a condition can be obtained by, for example, firstly depositing ITO to form a thin film having a thickness of 50 to 200 nm by sputtering on the interlayer insulating film 109, and then subjecting the thin film to sputtering into a desired shape by photolithographic method so that the pixel electrode 110 is formed.

In this embodiment, a baking treatment step for baking the protective layer 108 is further included between the protective layer forming step and the interlayer insulating film forming step shown in FIG. 6. In the liquid crystal display device 10 of the present invention, the IGZO semiconductor layer 104 is covered by the protective layer 108, and is attached to the CF substrate 13 through the interlayer insulating film forming step as described later so that the IGZO semiconductor layer 104 is completely shut off from outside. In such a state, oxygen desorption of the IGZO semiconductor layer 104 is considered to occur between the IGZO semiconductor layer 104 and the gate insulating film 103, and/or between the IGZO semiconductor layer 104 and the protective layer 108.

Considering the above, in the present embodiment, the baking treatment is performed at the highest temperature among the treatment temperatures in the respective production steps after forming the protective layer 108. In the respective production steps, the IGZO semiconductor layer 104 is formed at about room temperatures to about 150° C., whereas the gate insulating film 103, the protective layer 108, and the interlayer insulating film 109 to be described later are formed at around 200° C. to 220° C. Therefore, the baking treatment is performed at a temperature higher than the temperature in forming the gate insulating film 103, the protective layer 108, and the interlayer insulating film 109 (220° C. or higher), and thereby the oxygen content of the IGZO semiconductor layer 104 is controlled. The method of the baking treatment is not particularly limited, and a simple treatment of baking with a clean oven under air atmosphere may be employed.

Accordingly, oxygen is supplied to the IGZO semiconductor layer 104 via the protective layer 108. Alternatively, oxygen is supplied to the IGZO semiconductor layer 104 via the gate insulating film 103 and the protective layer 108. As a result, the oxygen concentration of the IGO semiconductor layer 104 becomes stable, and also oxygen desorption of the IGZO semiconductor layer 104 is avoided. Thereby the IGZO semiconductor layer 104 having a desired oxygen content can be achieved. The oxygen content may vary depending on the desired transistor characteristics to be obtained. The oxygen content of 90% or more reduces the difference from the oxygen content in the stoichiometric condition, and thus stable transistor characteristic can be achieved.

Figure 8:
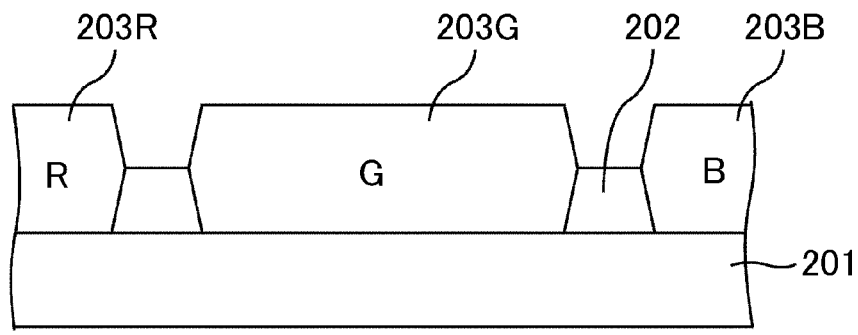
FIG. 8 is a schematic plain diagram showing a step of producing a CF substrate included the liquid crystal display device according to the first embodiment.
Figure 9:
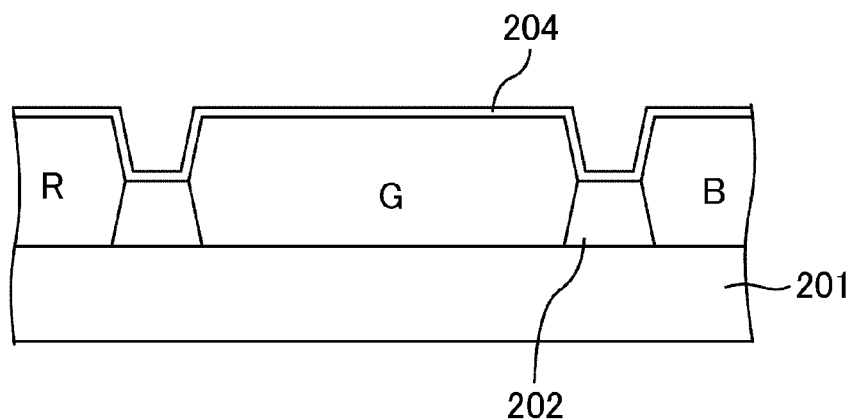
FIG. 9 is a schematic plain diagram showing a step of producing a CF substrate included the liquid crystal display device according to the first embodiment.
Figure 10:
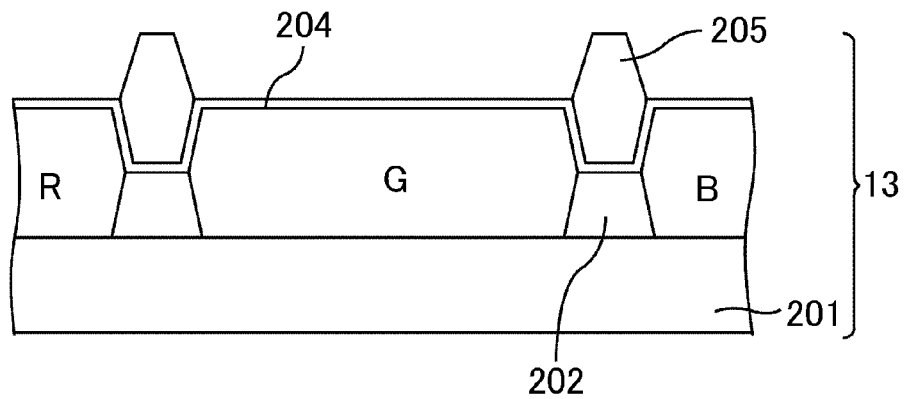
FIG. 10 is a schematic plain diagram showing a step of producing a CF substrate included the liquid crystal display device according to the first embodiment.

One example of the method of producing the CF substrate 13 is explained with reference to FIG. 8 to FIG. 10. FIG. 8 to FIG. 10 are each schematic plain diagram showing a step of producing a CF substrate included in the liquid crystal display device according to the first embodiment. First, as shown in FIG. 8, a photosensitive resin including a black pigment is patterned in a desired shape on the main surface of the glass substrate 201 by a photolithographic method to form a light shielding member 202. Next, photosensitive resins each containing a red pigment (R), a green pigment (G), or a blue pigment (B) are applied in the regions sectioned by the light shielding members 202 so that CF layers 203R, 203G, and 203B are formed.

As shown in FIG. 9, a transparent electrode material such as ITO is deposited to have a thickness of 50 to 200 nm on the surface of the substrate by sputtering. Thereafter, by a photolithographic method, the counter electrode 204 having a desired pattern is formed. Further, as shown in FIG. 10, photospacers 205 are formed at the regions where the light shielding members 202 are formed. The photospacers 205 can be obtained by using photosensitive resins and patterning in a desired shape by a photolithographic method.

A polyimide resin is applied on the surfaces of the above produced TFT array substrate 11 and the CF substrate 13 by a printing method to form alignment films (not shown). The thus obtained both substrates are attached each other with a sealing material in between. Then, liquid crystals are filled in between the substrates by a dropping method, an injection method, or the like. The attached substrates were subjected to dicing to be divided, followed by mounting of necessary items such as a driving device, a casing, and a light source, and thereby a liquid crystal display device 10 of the present embodiment is obtained.

In the present embodiment, an IGZO semiconductor having a specific atom composition is formed as mentioned earlier. Moreover, after the protective layer 108 is formed, a baking treatment is performed at the highest temperature among the temperatures in the above protection steps. As a result, the oxygen concentration of the IGZO semiconductor layer 104 becomes stable, and oxygen desorption of the IGZO semiconductor layer 104 does not occur after the baking treatment. Thereby a highly credible liquid crystal display device 10 can be provided.

Specific examples of the liquid crystal display device 10 of the present embodiment is described below.

Example 1

In the liquid crystal display device 10 according to the first embodiment, an IGZO semiconductor layer having a thickness of 50 nm was formed by using a sputtering target having the In:Ga:Zn:O ratio=1:1:1:4.

In order to control the oxygen content of the IGZO semiconductor layer 104, a baking treatment was performed at 350° C. in the atmosphere for one hour after forming the protective layer 108. A clean oven was used herein for the one-hour baking treatment at 350° C. in the atmosphere.

The composition of the constituent atoms of the IGZO semiconductor layer 104 at a depth of about 20 nm from the surface thereof was measured by AES (Auger Electron Spectroscopy) analysis. The AES analysis was conducted with an AES analyzer (produced by JEOL Ltd., Model No. JAMP-9500F) in the following measurement conditions. Electron irradiation condition: 5 kV, 5 nA; Sample: 75 degrees inclination; Neutralization condition: Ar ion 10 eV, 1 μA; Energy resolution of detector: dE/E=0.35%, Detection energy step: 1.0 eV. Detected peaks for respective constituent atoms of In, Ga, Zn, O, and Si were obtained.

The AES analysis was explained here in detail. The AES analysis is performed by irradiating a measuring target spot of a sample with electron beams, and obtaining the spectrum based on the kinetic energy and the detected intensity of the auger electron emitted from the surface. Since a peak location and a shape of a spectrum are unique to each element, the element is identified based on the peak location and the shape of the spectrum. The concentration of the element in the material is calculated from the intensity (amplitude) of the spectrum. Accordingly, the element analysis is performed. Further, since the peak location and the shape of the spectrum are unique to bonding state of the atom, chemical bonding states (oxidation state, or the like) of the elements can also be analyzed.

The Auger electron consists of a very small portion of a huge amount of the detected electron, and therefore notably receives background influences of low frequency components. In this example, in order to obtain a more accurate oxygen content, Rutherford Backscattering Spectrometry (RBS) and Particle Induced X-ray Emission (PIXE) were also performed in addition to the AES analysis. The values obtained were used to correct the sensitivity factor.

Namely, as is generally performed, the spectrum was differentiated to remove the backgrounds of the low frequency components. Then, the composition ratio was calculated from the peak intensities of the respective elements using the sensitivity factor (the values of pure elements accompanied with the device) unique to each element. Based on the measurement result, the oxygen content was calculated by the general formula mentioned later.

Meanwhile, the peak intensity and the shape of each element change if the chemical bonding state largely changes. For this reason, the sensitivity factor needs to be corrected to obtain the composition ratio with higher accuracy. Therefore, the sensitivity factor is corrected as mentioned below upon calculating the composition ratio.

Specifically, in order to check the oxidation state or reduction state of In, the abundance of In in the states of In (pure metal) and $In(In_2O_3)$ was calculated by a procedure mentioned later. Namely, the differentiated In spectrum obtained in the AES analysis was subjected to nonnegative-constrained least squares fitting in the standard measurement peak of In (pure metal) and In ($In_2O_3$) to separate each element. The composition ratio was calculated using the sensitivity factor (the values of pure elements accompanied with the device).

The oxygen content was obtained by the general formula below.

$$O(atomic\ \%)/\{In(atomic\ \%) \times 3/2 + Ga(atomic\ \%) \times 3/2 + Zn(atomic\ \%)\}$$

Figure 11:
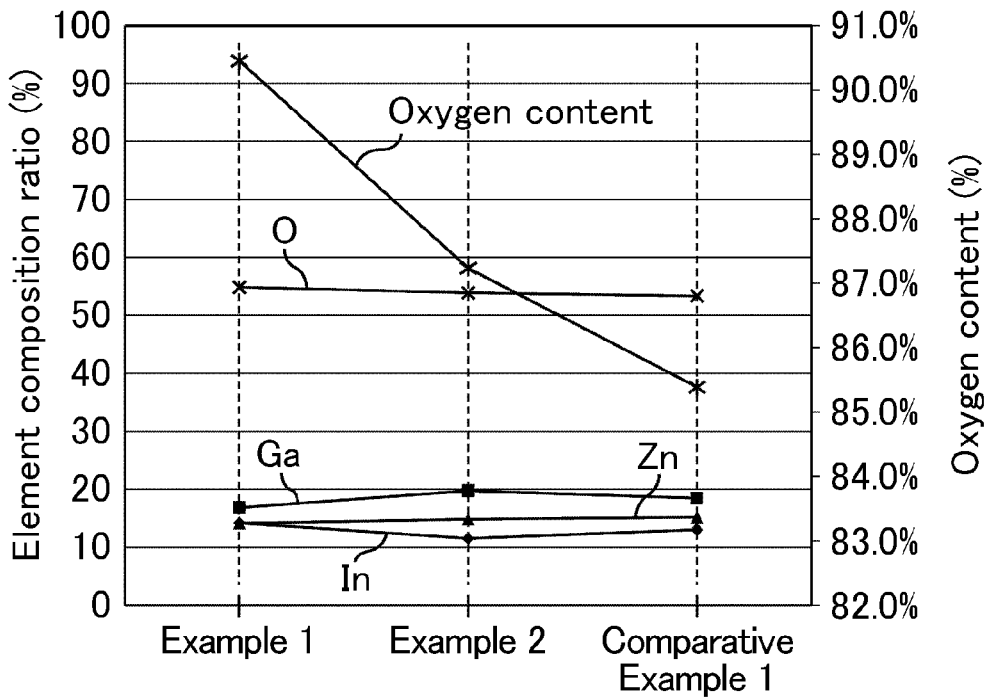
FIG. 11 is a graph showing the composition and the oxygen contents of the oxide semiconductor included in channel layers of the TFTs according to Examples 1 and 2, and Comparative Example 1.

By this calculation, the composition of the IGZO semiconductor included in the channel layer of the TFT 15 was obtained as shown in a graph in FIG. 11. FIG. 11 is the graph showing the composition and the oxygen content of the oxide semiconductor included in the channel layer of the TFT in Example 1, and Example 2 and Comparative Example 1 described later.

Further, TFT characteristics of the obtained TFT array substrate 11 were measured. For measuring the TFT characteristics, the threshold value (Vth), mobility ($\mu$), and sub-threshold swing value (S) were calculated based on the measurement result shown in the graph in FIG. 12. The characteristics were judged based on the criteria for judging mentioned below. Each of the judging criteria needs to be satisfied by all the Vth, $\mu$, and S. Even one unsatisfied item leads to a judgment of inappropriate.

++: $0\ V < Vth < 10\ V$, $\mu > 5$, $S < 1.5$
+: $-5\ V < Vth < 10\ V$, $\mu \geq 1$, $S \leq 2.5$
−: $-10\ V < Vth < 15\ V$, $\mu < 1$, $S > 2.5$, or unmeasurable (−)

Figure 12:
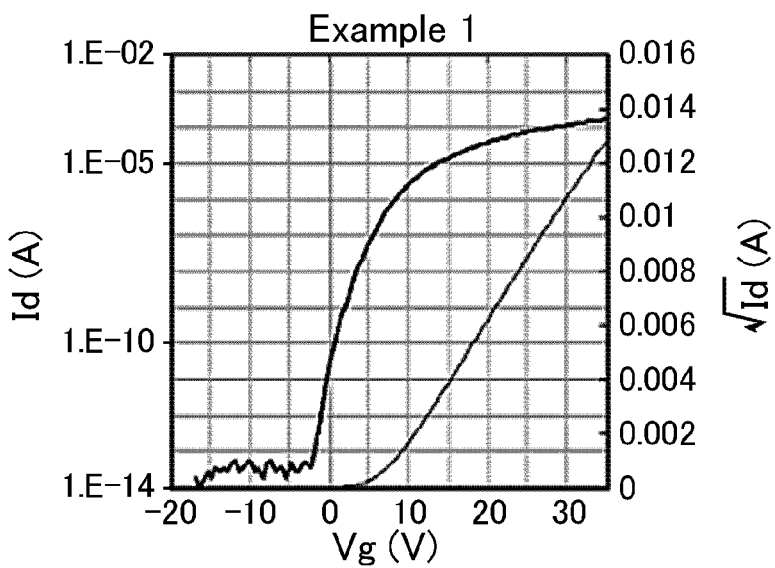
FIG. 12 is a graph showing electric properties of a TFT of a display device according to Example 1.

FIG. 12 is a graph showing the electric properties of the TFT of the display device in Example 1. In the graph in FIG. 12, the bold line shows the Vg–Id characteristics, and the thin line shows the Vg–√Id characteristics. Here, Vg refers to a gate voltage, and Id refers to a drain current.

The graph in FIG. 12 and Table 1 below show the obtained measurement results.

TABLE 1

| | Vth[V] | $\mu[cm^2/Vs]$ | S[V/dec] | Judgement |
|---|---|---|---|---|
| Example 1 | 6.89 | 7.67 | 1.27 | ++ |
| Example 2 | 5.91 | 4.88 | 2.00 | + |
| Comparative Example 1 | — | — | — | − |

Example 2

The composition of the IGZO semiconductor was set to the values shown in the graph in FIG. 11. The baking treatment was performed with a clean oven at 220° C. for one hour in the same manner as in Example 1. Except for the above, various physical characteristic values were measured in the same manner as in Example 1.

Figure 13:
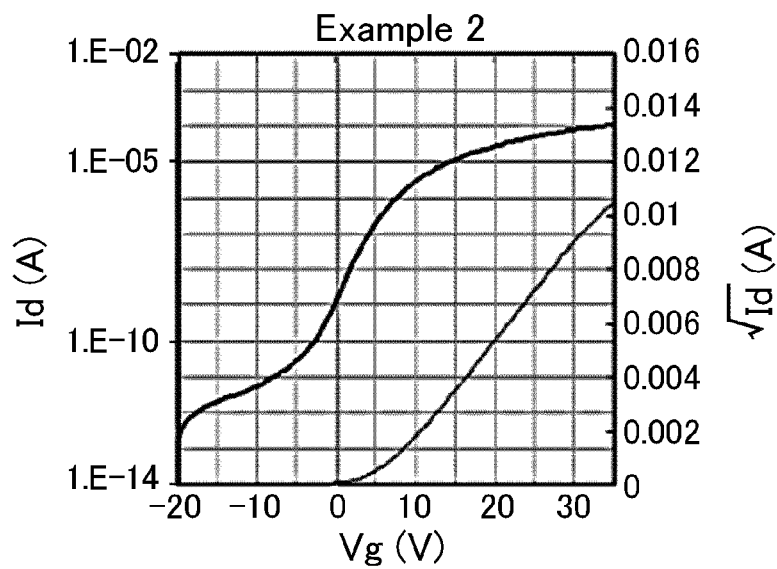
FIG. 13 is a graph showing electric properties of a TFT of a display device according to Example 2.

Table 1 and FIG. 13 show the obtained measurement results. FIG. 13 is a graph showing the electric properties of the TFT of the display device in Example 2.

Comparative Example 1

Figure 14:
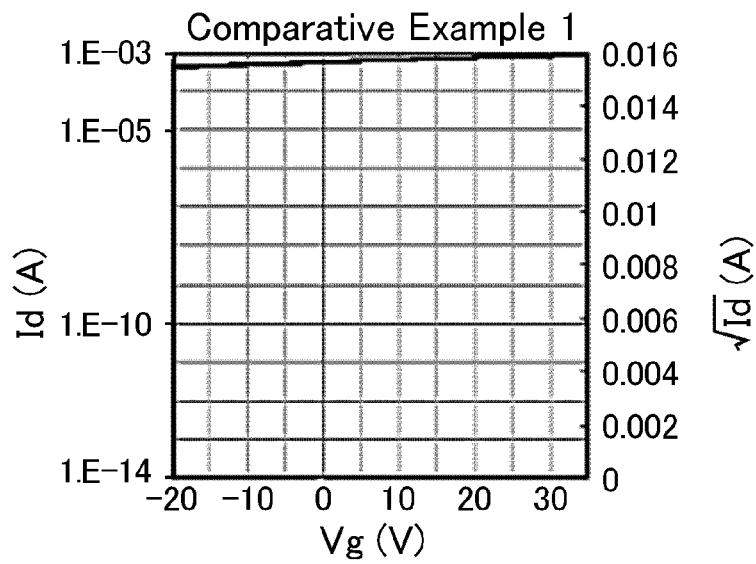
FIG. 14 is a graph showing electric properties of a TFT of a display device according to Comparative Example 1.

The composition of the IGZO semiconductor was set to the values shown in the graph in FIG. 11. Baking treatment was not performed after forming the protective layer 108. Except for the above, the physical characteristic values were measured in the same manner as in Example 1. Table 1 and FIG. 14 show the obtained measurement results. FIG. 14 is a graph showing the electric properties of the TFT of the display device in Comparative Example 1.

Table 1 and the graphs shown in FIGS. 12 to 14 reveal that the TFTs in Example 1 and Example 2 have excellent electric properties. It is also clarified that the TFT in Comparative Example 1 is inferior in the thin film transistor characteristics.

The above embodiment is explained with an example in which the light shielding member 202 and the CF layer are provided on the counter substrate side. However, the present invention is not limited to this mode, and those members may be formed on the TFT array substrate 11 side.

The above embodiment is explained with an example in which the IGZO semiconductor is used as the channel layer of the TFT. However, the present invention is not limited to this example, and the IGZO semiconductor is applicable for transparent electrodes or the like.

Further, the above embodiments are explained by exemplifying the liquid crystal display device. However, the present invention is not limited to the examples, and is applicable for an organic EL display device, a plasma display device, a field emission display device, or the like.

The aforementioned embodiments in examples may be combined in a scope not departing from the principles of the present invention.

The present application claims priority to Patent Application No. 2009-154104 filed in Japan on Jun. 29, 2009 under the Paris Convention and provisions of national law in a designated State, the entire contents of which are hereby incorporated by reference.

EXPLANATION OF REFERENCE NUMERALS

10: Liquid crystal display device
11: TFT array substrate
12: Liquid crystal layer
13: CF substrate
15: TFT
101, 102: Glass substrate
102a, 102b, 102c: Scanning wiring layer
102: Scanning wiring
103: Gate insulating film
104: Oxide semiconductor layer
106a, 106b: Signal wiring layer
106: Signal wiring
107a, 107b: Drain electrode layer
107: Drain electrode
108: Protective layer

109: Interlayer insulating film
110: Pixel electrode
121: Channel protective layer
202: Light shielding member
203R, 203G, 203B: CF
204: Counter electrode
205: Photospacer

The invention claimed is:

1. A thin film transistor substrate comprising:
a substrate body:
a gate electrode provided on the substrate body;
a gate insulating film provided on the gate electrode;
an oxide semiconductor film provided directly on the gate insulating film and including an overlapped portion that overlaps with the gate electrode;
a source electrode provided on the oxide semiconductor layer;
a drain electrode provided on the oxide semiconductor film and opposed to the source electrode at the overlapped portion; and
a protective film provided on the overlapped portion of the oxide semiconductor film, the source electrode, and the drain electrode, wherein
the protective film includes material containing an oxygen atom and is in direct contact with a portion of the oxide semiconductor film,
the oxide semiconductor film is sandwiched by the gate insulating film and the protective film in a thickness direction of the substrate body,
the oxide semiconductor film includes indium, gallium, zinc and oxygen as constituent atoms, and
the oxygen content of the oxide semiconductor, which directly contacts both the gate insulating film and the protective film, is 87% to 95% in accordance with the following formula:

$$O(atomic\,\%)/\{In(atomic\,\%) \times 3/2 + Ga(atomic\,\%) \times 3/2 + Zn(atomic\,\%)\}.$$

2. The thin film transistor according to claim 1, wherein a current that flows through a channel layer of the oxide semiconductor film when no voltage is applied to the gate electrode is less than $10^{-8}$ A.

3. The thin film transistor according to claim 2, wherein the protective film is CVD deposited silicon oxide film.

4. The thin film transistor according to claim 2, wherein the current flow that flows through the channel layer when no voltage is applied to the gate electrode is less than $10^{-10}$ A.

5. The thin film transistor according to claim 4, wherein the protective film is CVD deposited silicon oxide film.

* * * * *